US012267968B2

United States Patent
Menea et al.

(10) Patent No.: US 12,267,968 B2
(45) Date of Patent: Apr. 1, 2025

(54) FOLDING PORTABLE DISPLAY DEVICE

(71) Applicant: Google LLC, Mountain View, CA (US)

(72) Inventors: Adrian Gheorghe Menea, Palo Alto, CA (US); Yi Tao, San Jose, CA (US); Kiarash Vakhshouri, San Jose, CA (US); Taesung Kim, Cupertino, CA (US); Yiting Liu, New Taipei (TW); Michael J. Lombardi, Chicago, IL (US); Hao-Yuan Hou, Zhubei (TW)

(73) Assignee: Google LLC, Mountain View, CA (US)

( * ) Notice: Subject to any disclaimer, the term of this patent is extended or adjusted under 35 U.S.C. 154(b) by 169 days.

(21) Appl. No.: 17/756,387

(22) PCT Filed: Sep. 7, 2021

(86) PCT No.: PCT/US2021/049241
§ 371 (c)(1),
(2) Date: May 24, 2022

(87) PCT Pub. No.: WO2023/038616
PCT Pub. Date: Mar. 16, 2023

(65) Prior Publication Data
US 2023/0320003 A1    Oct. 5, 2023

(51) Int. Cl.
*H05K 5/02* (2006.01)
*H10K 77/10* (2023.01)
*H10K 102/00* (2023.01)

(52) U.S. Cl.
CPC ......... *H05K 5/0217* (2013.01); *H10K 77/111* (2023.02); *H10K 2102/311* (2023.02)

(58) Field of Classification Search
CPC .................................................. H05K 5/00
See application file for complete search history.

(56) References Cited

U.S. PATENT DOCUMENTS 10,331,247 B2   6/2019  Jinbo et al.
11,474,564 B2  10/2022  Soh
(Continued)

FOREIGN PATENT DOCUMENTS

CN   101043799 A   9/2007
CN   101910966 B   1/2013
(Continued)

OTHER PUBLICATIONS

Office Action, and translation thereof, from counterpart Taiwanese Application No. 111109518 dated Feb. 17, 2023, 6 pp.
(Continued)

*Primary Examiner* — Jerry Wu
(74) *Attorney, Agent, or Firm* — Shumaker & Sieffert, P.A.

(57) ABSTRACT

An example display assembly includes: a continuous display including: a first rigid segment attached to and substantially coplanar with an inner surface of a first assembly of the folding device; a second rigid segment attached to and substantially coplanar with an inner surface of a second assembly of the folding device; a primary flexible segment; a third rigid segment disposed between the second rigid segment and the primary flexible segment; and a fourth rigid segment disposed between the first rigid segment and the primary flexible segment; a primary supporting plate attached to the continuous display; a first supplemental supporting plate attached to the primary supporting plate adjacent to the third rigid segment; and a second supplemental supporting plate attached to the primary supporting plate adjacent to the fourth rigid segment.

13 Claims, 8 Drawing Sheets

(56) References Cited

U.S. PATENT DOCUMENTS

| | | |
|---|---|---|
| 2015/0330614 A1 | 11/2015 | Lee et al. |
| 2016/0187931 A1 | 6/2016 | Myung et al. |
| 2019/0196548 A1 | 6/2019 | Kim et al. |
| 2021/0027666 A1 | 1/2021 | Wang |
| 2021/0255666 A1* | 8/2021 | Kim .................. H04M 1/0268 |

FOREIGN PATENT DOCUMENTS

| | | |
|---|---|---|
| CN | 106201303 A | 12/2016 |
| CN | 107567608 A | 1/2018 |
| CN | 111816070 A | 10/2020 |
| CN | 112306147 A | 2/2021 |
| CN | 112581865 A | 3/2021 |
| EP | 3805897 A1 | 4/2021 |
| JP | 2020184079 A | 11/2020 |
| TW | 1710308 B | 11/2020 |
| WO | 2021129882 A | 7/2021 |

OTHER PUBLICATIONS

Jaszly, "New Samsung Galaxy Fold gets an iFixit teardown, still abysmally unfixable and fragile," Gizmochina, Retrieved May 13, 2022 from: https://www.gizmochina.com/2019/10/08/new-samsung-galaxy-fold-gets-an-ifixit-teardown-still-abysmallyunfixable-and-fragile/, Oct. 8, 2019, 3 pp.

International Search Report and Written Opinion of International Application No. PCT/US2021/049241, mailed May 13, 2022, 12 pp.

Response to Communication Pursuant to Rules 161(1) and 162 EPC dated Jan. 11, 2024, from counterpart European Application No. 21786065.9, filed Jul. 3, 2024, 18 pp.

Office Action from counterpart Japanese Application No. 2024-513264 dated Nov. 19, 2024, 17 pp.

Response to Office Action, and translation thereof, dated Nov. 19, 2024 from U.S. Patent Application No. 2024-513264 filed Feb. 13, 2025, 6 pp.

* cited by examiner

FOLDING PORTABLE DISPLAY DEVICE

This application is a national stage entry of WO International Patent Application No. PCT/US2021/049241, filed 7 Sep. 2021, the entire contents of which is incorporated herein by reference.

BACKGROUND

Devices that include displays may be referred to as display devices. In general, it may be desirable to increase a size of a display (e.g., the area on which images are displayed) as much as possible. Increasing the size of a display may make the device that includes the display large and unwieldy. For instance, devices with larger displays may not fit in pockets, bags, and the like. One way to increase the size of a display without unduly increasing the size of the device is to make the device collapsible such that the display can be folded (e.g., in half). However, folding displays may exhibit creases where the display bends.

SUMMARY

In general, aspects of this disclosure are directed to folding devices that include foldable continuous displays with supported a span. A folding device may include at least two assemblies (e.g., panels) and a mechanism configured to allow the assemblies to be moved into a collapsed state in which the device is considered closed and an expanded state in which the device is considered open. When the device is in the expanded state, a display may be visible and may cover at least a portion of an inner surface of all of the assemblies. As such, the device may be considered to be a continuous display (i.e., because it continues across a boundary between the assemblies). By utilizing such a folding device, the device may include a display with a relatively large length and/or width (e.g., display area) without overly increasing a length and/or width of the device when in the collapsed state. In this way, the "pocketability" of large-screen portable devices may be improved.

However, in some examples, some designs for mechanisms that enable assemblies to be moved may introduce one or more disadvantages. For example, some designs may result in a large portion of the display being unsupported or inadequately supported when the device is in the expanded state. The unsupported or inadequately supported portion of the display may be a span in the display (i.e., a primary flexible segment of the display that connects two halves of the folding device). Due to a variety of factors, including a lack of sufficient support and repeated bending, a crease may form in the span. Such a crease may be undesirable as it may present undesirable visual appearance and/or undesirable tactile feedback. The visual appearance and tactile feedback presented by the crease may be positively correlated with a depth of the crease. As such, it may be desirable to minimize the depth of the crease.

In accordance with one or more aspects of this disclosure, a folding device may include a plurality of supporting plates configured to provide support to a span of a continuous display of the folding device (e.g., the portion of the display between main assemblies of the folding device). For instance, the folding device may include a primary supporting plate that supports nearly all of the continuous display and two supplemental supporting plates attached to the primary supporting plate that provide additional support to the span. By including the supplemental supporting plates, a depth of a crease in the continuous display may be reduced. In this way, visual appearance of the display may be improved and/or tactile feedback provided by the crease may be reduced.

In one example, a folding device includes a first assembly having an inner and an outer surface; a second assembly having an inner and an outer surface; a continuous display including: a first rigid segment attached to and substantially coplanar with the inner surface of the first assembly; a second rigid segment attached to and substantially coplanar with the inner surface of the second assembly; a primary flexible segment; a third rigid segment disposed between the second rigid segment and the primary flexible segment, wherein the third rigid segment is articulable relative to the second rigid segment; and a fourth rigid segment disposed between the first rigid segment and the primary flexible segment, wherein the fourth rigid segment is articulable relative to the first rigid segment; a primary supporting plate attached to the continuous display; a first supplemental supporting plate attached the primary supporting plate adjacent to the third rigid segment of the continuous display; and a second supplemental supporting plate attached to the primary supporting plate adjacent to the fourth rigid segment of the continuous display.

In another example, a display assembly of a folding device includes: a continuous display including: a first rigid segment attached to and substantially coplanar with an inner surface of a first assembly of the folding device; a second rigid segment attached to and substantially coplanar with an inner surface of a second assembly of the folding device; a primary flexible segment; a third rigid segment disposed between the second rigid segment and the primary flexible segment, wherein the third rigid segment is articulable relative to the second rigid segment; and a fourth rigid segment disposed between the first rigid segment and the primary flexible segment, wherein the fourth rigid segment is articulable relative to the first rigid segment; a primary supporting plate attached to the continuous display; a first supplemental supporting plate attached the primary supporting plate adjacent to the third rigid segment of the continuous display; and a second supplemental supporting plate attached to the primary supporting plate adjacent to the fourth rigid segment of the continuous display.

The details of one or more examples are set forth in the accompanying drawings and the description below. Other features, objects, and advantages of the disclosure will be apparent from the description and drawings, and from the claims.

DETAILED DESCRIPTION

Figure 1A:
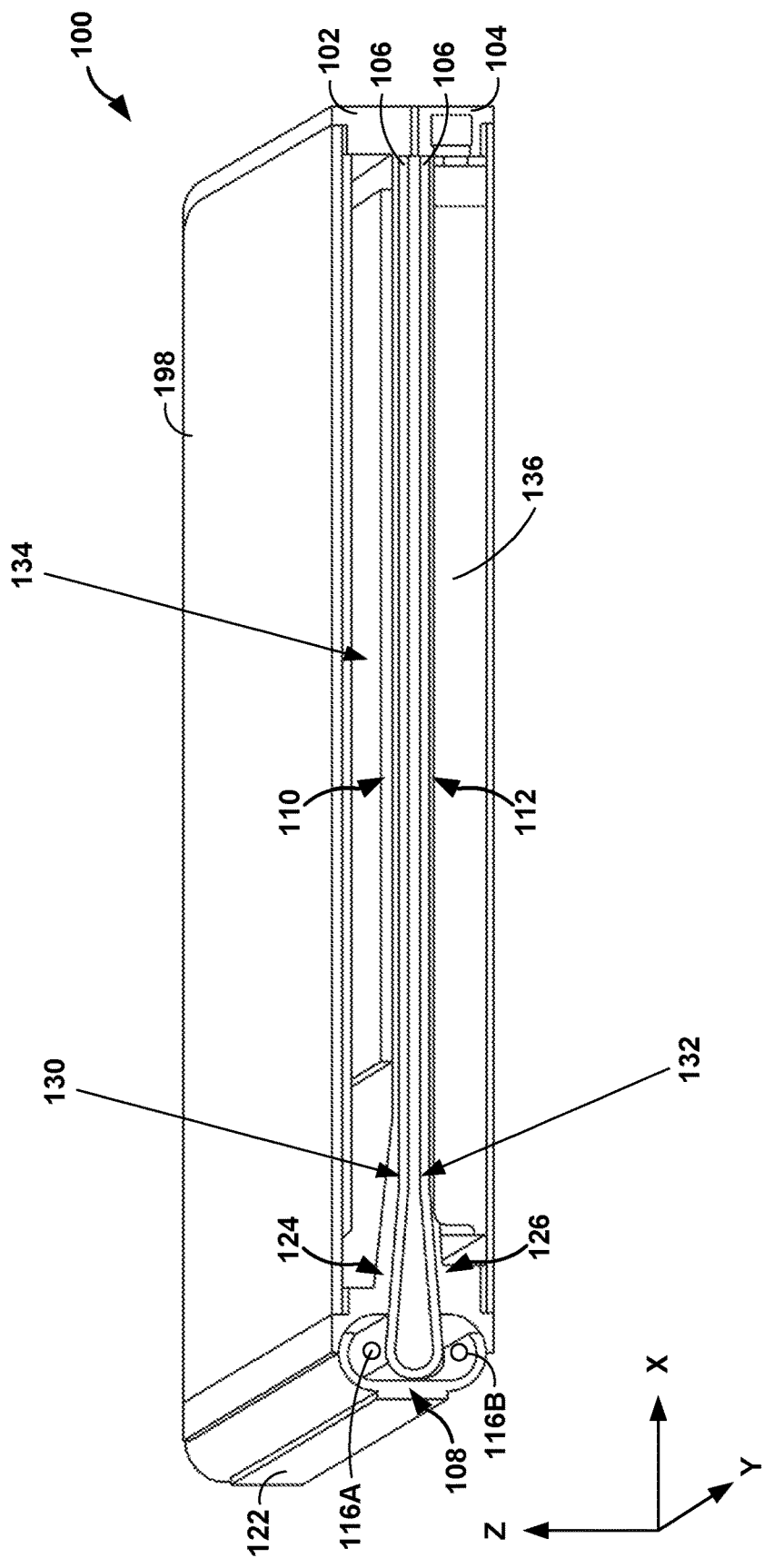
FIGS. 1A and 1B are schematic diagrams illustrating cross sections of a folding device with a multi-rigid segment flexible display, in accordance with one or more aspects of this disclosure.

FIG. 1A is a schematic diagram illustrating a cross section of a folding device with a multi-rigid segment flexible display, in accordance with one or more aspects of this disclosure. Examples of device 100 include foldable mobile computing devices such as foldable smart phones, foldable tablets, foldable e-readers, foldable gaming systems, or any other foldable portable device that includes a display.

As shown in FIG. 1A, device 100 includes first assembly 102, second assembly 104, continuous display 106, and hinge assembly 122. First assembly 102 may be configured to rotate about first axis 116A, which defines a first axis in the y-direction, and second assembly 104 may be configured to rotate about second axis 116B, which defines a second axis in the y-direction. Each of first assembly 102 and second assembly 104 may include an inner surface and an outer surface. The outer surface of first assembly 102 may be visible when looking down at device 100 in the z-axis and the outer surface of second assembly 104 may be visible when looking up at device 100 in the z-axis. The inner surfaces of first assembly 102 and second assembly 104 may not be externally visible when device 100 is closed.

As shown in FIG. 1A, first assembly 102 may include main logic board 134 and second assembly 104 may include battery 136. This is merely one example arrangement of components amongst first assembly 102/second assembly 104 and other arrangements are possible. For instance, both first assembly 102 and second assembly 104 may include respective batteries.

Continuous display 106 may be capable of rendering data into images viewable by a user of device 100. For example, continuous display 106 may include a matrix of pixels that are individually controllable. Examples of continuous display 106 include, but are not limited to, liquid crystal displays (LCD), light emitting diode (LED) displays, organic light-emitting diode (OLED) displays, micro light-emitting diode (microLED) displays, or similar monochrome or color displays capable of outputting visible information to a user of device 100.

In some examples, device 100 may include one or more displays in addition to continuous display 106. For instance, as shown in FIG. 1A, device 100 may include a first additional display on the outer surface of first assembly 302 (e.g., display 198). In some examples, device 100 may further include a second additional display on the outer surface of second assembly 104.

One or more of continuous display 106, the first additional display, and/or the second additional display may be presence-sensitive displays. In some examples, a presence sensitive display may detect an object at and/or near a screen. As one example range, a presence-sensitive display may detect an object, such as a finger or stylus that is within 2 inches or less of the screen. The presence-sensitive display may determine a location (e.g., an (x,y) coordinate) of a screen at which the object was detected. In another example range, a presence-sensitive display may detect an object six inches or less from the screen and other ranges are also possible. The presence-sensitive display may determine the location of the screen selected by a user's finger using capacitive, inductive, and/or optical recognition techniques. In some examples, presence sensitive display also provides output to a user using tactile, audio, or video stimuli.

Continuous display 106 includes first rigid segment 110 attached to first assembly 102 (e.g., positioned on the inner surface of first assembly 102 and substantially coplanar with the inner surface of first assembly 102), flexible segment 108, and second rigid segment 112 attached to second assembly 104 (e.g., positioned on the inner surface of second assembly 104 and substantially coplanar with the inner surface of first assembly 102). As can be seen in the example of FIG. 1, flexible segment 108 further includes rigid segment 124 connecting rigid segment 110 to flexible segment 108 and rigid segment 126 connecting rigid segment 112 to flexible segment 108. When device 100 is fully open, rigid segment 124 may be substantially coplanar with the inner surface of first assembly 102 (e.g., +/−5 degrees or +/−1 degree) and rigid segment 126 may be substantially coplanar with the inner surface of second assembly 104 (e.g., +/−5 degrees or +/−1 degree). However, when device 100 is fully closed, rigid segment 124 may not be coplanar with the inner surface of first assembly 102 and rigid segment 126 may not be coplanar with the inner surface of second assembly 104. Rigid segment 124 may be articulable relative to rigid segment 110 at hinge point 130. Rigid segment 126 may be articulable relative to rigid segment 112 at hinge point 132.

Rigid segments 110 and 112 may be referred to as primary rigid segments while rigid segments 124 and 126 may be referred to as secondary rigid segments. In some examples, a width (e.g., in the x-direction) of the primary rigid segments may be substantially larger than a width of the secondary rigid segments. For instance, a width of rigid segment 124 may be less than or equal to a quarter (25%) of a width of rigid segment 110. Similarly, a width of rigid segment 126 may be less than or equal to a quarter (25%) of a width of rigid segment 112.

The secondary rigid segments may be articulable relative to neighboring primary rigid segments. As one example, rigid segment 124 may be articulable relative to rigid segment 110 at hinge point 130. As another example, rigid segment 126 may be articulable relative to rigid segment 112 at hinge point 132. In some examples, the articulation points between secondary rigid segments and primary rigid segments (e.g., hinge points 130 and 132) may have large radii and limited movement as compared to the radius and movement of primary flexible segment 108. As one example, rigid segment 124 may be configured to articulate at most 45 degrees relative to rigid segment 110. As another example, rigid segment 126 may be configured to articulate at most 45 degrees relative to rigid segment 112.

Primary flexible segment 108 may connect the rigid segments of one side of device 100 to the rigid segments of the other side of device 100. For instance, as shown in FIG. 1, primary flexible segment 108 may connect rigid segment 124 to rigid segment 126. Primary flexible segment 108 may be configured to fold at least 180 degrees (e.g., to facilitate closure of device 100).

In accordance with one or more techniques of this disclosure, device 100 may include one or more supporting plates (e.g., backer plates) configured to render segments of continuous display 106 flexible or rigid. The supporting plates may be positioned between emissive elements of continuous display 106 (e.g., OLEDs) and the inner surfaces of first assembly 102 and second assembly 104.

In some examples, device 100 may include respective supporting plates for segments of continuous display 106. For instance, the one or more supporting plates may include a first supporting plate attached to first rigid segment 110, a second supporting plate attached to second rigid segment 112, a third supporting plate attached to rigid segment 124, and/or a fourth supporting plate attached to rigid segment 126.

In some examples, the one or more supporting plates may include a respective supporting plate for each of first assembly 102 and second assembly 104 that support segments of continuous display 106 on the respective assembly. For instance, the one or more supporting plates may include a first supporting plate attached to first rigid segment 110 and rigid segment 124 that is configured to permit bending between first rigid segment 110 and rigid segment 124, and a second supporting plate attached to second rigid segment 112 and rigid segment 126 that is configured to permit bending between second rigid segment 112 and rigid segment 126.

In some examples, the one or more supporting plates may include a single supporting plate that is attached to segments of continuous display 106 on both first assembly 102 and second assembly 104. For instance, the one or more supporting plates may include a single supporting plate attached to primary flexible segment 108 and all primary and secondary rigid segments (e.g., first rigid segment 110, second rigid segment 112, rigid segment 124 and rigid segment 126). The single supporting plate may be configured to permit bending between the segments. To permit bending between segments, a supporting plate may be etched and/or perforated at a boundary between adjacent segments.

Figure 1B:
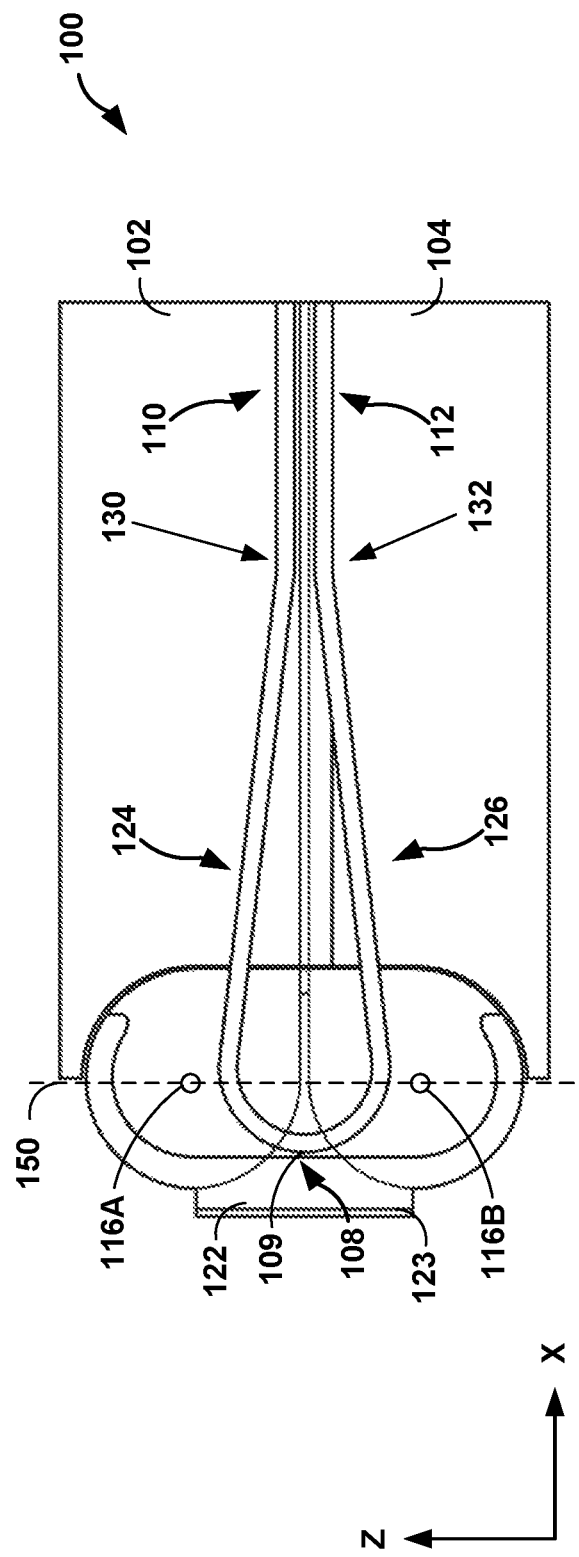

FIG. 1B is a schematic diagram illustrating a cross section of a folding device with a multi-rigid segment flexible display that includes multiple secondary rigid segments, in accordance with one or more aspects of this disclosure. As shown in FIG. 1B, display 106 may include primary rigid segments 110 and 112, primary flexible segment 108, and secondary rigid segments 124 and 126.

In some examples, hinge assembly 122 may include a cavity into which at least a portion of display 106 may recede when device 100 is fully closed. For instance, as discussed in further detail below, a center region of hinge assembly 122 may be "hollowed out" to receive at least a portion of primary flexible segment 108. As shown in FIG. 1B, when the folding device 100 is fully closed, an apex of the primary flexible segment (e.g., apex 109 of primary flexible segment 108) is closer to the outer surface of the hinge assembly (e.g., outer surface 123 of hinge assembly 122) than a plane that is parallel to the first axis and a second axis (e.g., plane 150 that is parallel to first axis 116A and second axis 116B). By allowing at least a portion of display 106 to recede when device 100 is fully closed, device 100 may avoid the need for a rotate and slide mechanism. In this way, the design of a foldable display device may be simplified.

Figure 2:
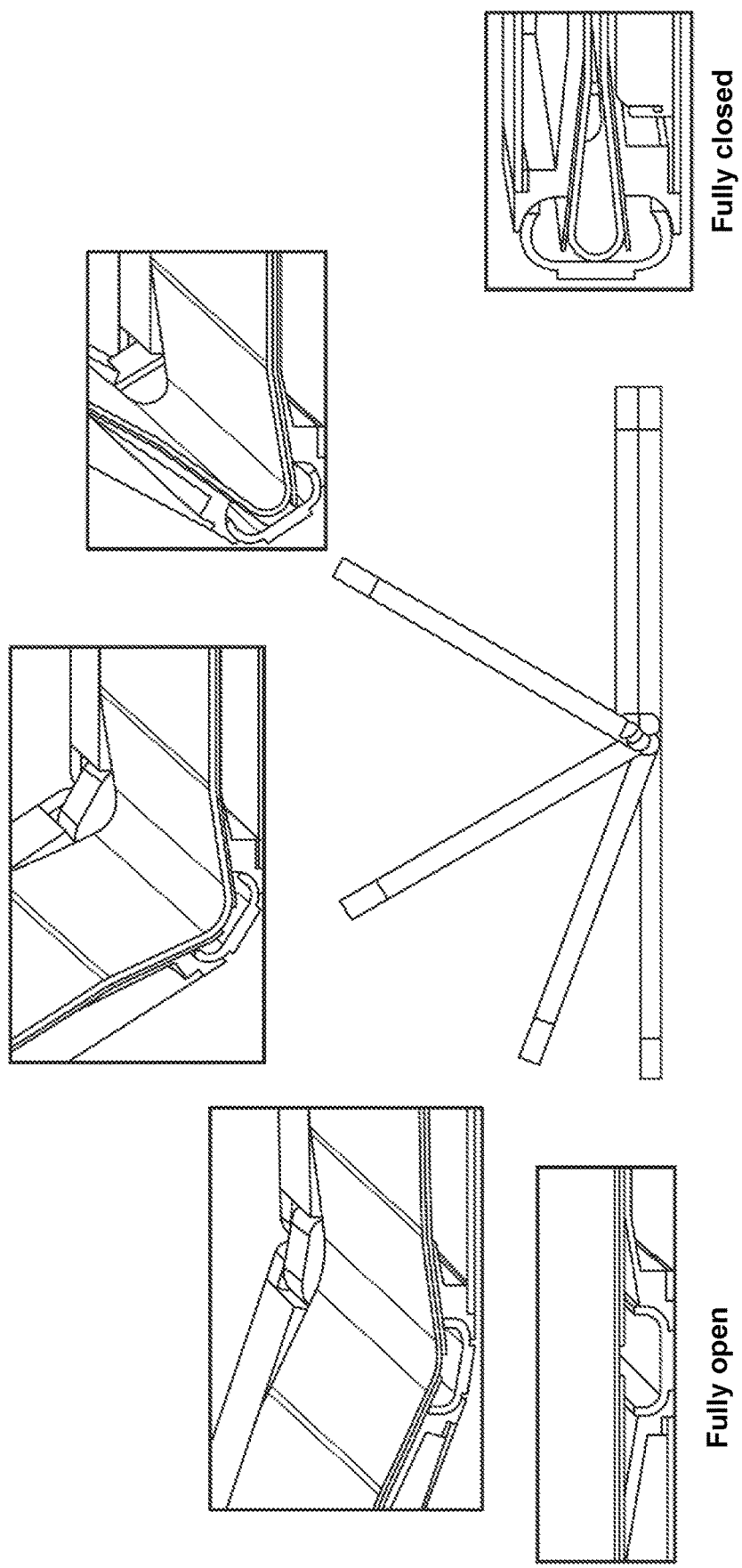
FIG. 2 is a schematic diagram illustrating a folding device with a flexible display in a plurality of folded states, in accordance with one or more aspects of this disclosure.

FIG. 2 is a schematic diagram illustrating a folding device with a flexible display in a plurality of folded states, in accordance with one or more aspects of this disclosure. As can be seen in FIG. 2, at least a portion of a primary flexible segment of a display resides within a hinge assembly while the folding device is closed. As also shown in FIG. 2, when the folding device is fully open, an inner surface of a first assembly is coplanar with an inner surface of a second assembly.

Figure 3A:
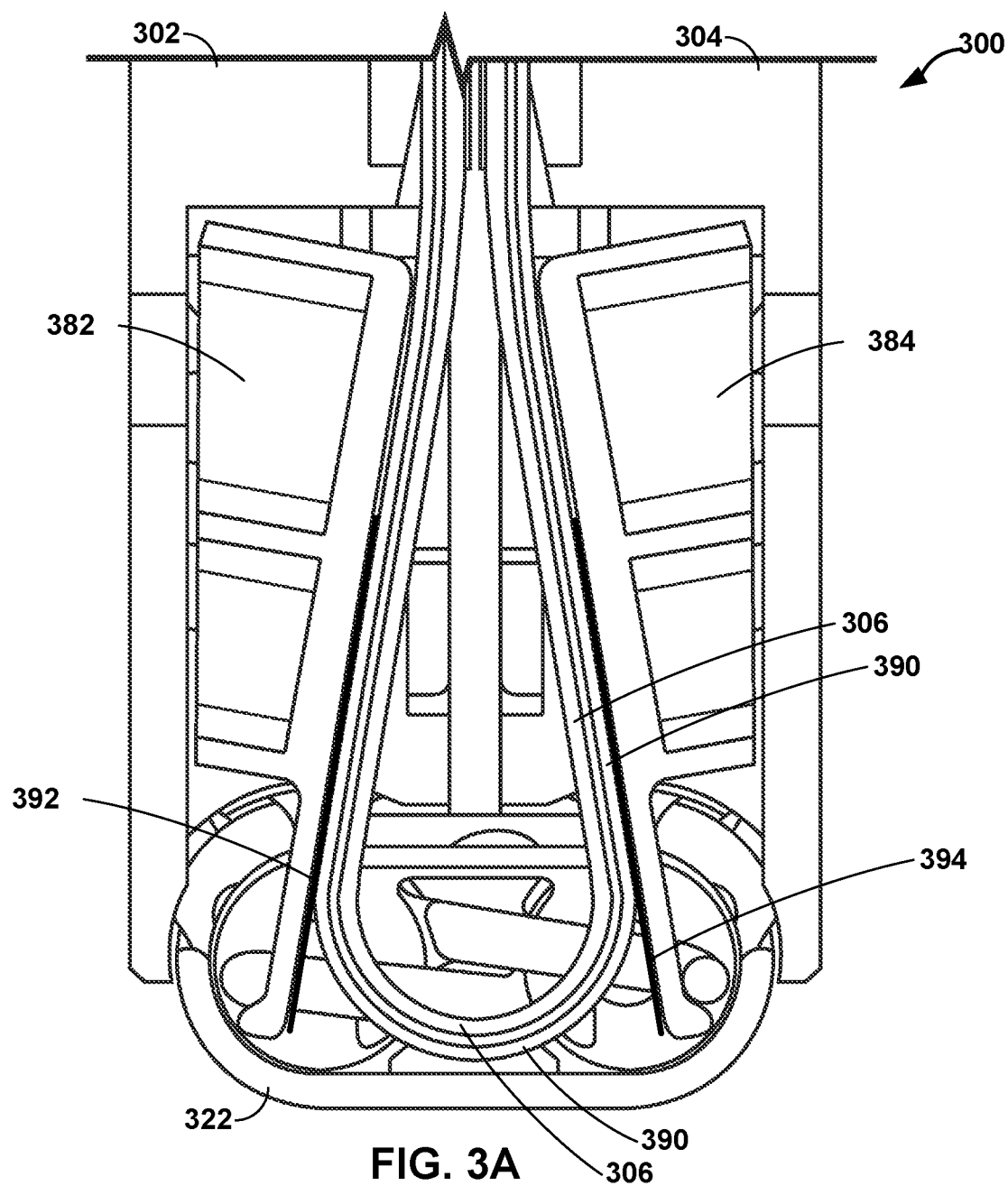
FIGS. 3A and 3B are schematic diagrams illustrating cross sections of a folding device with a flexible display having support platforms in a variety of positions, in accordance with one or more aspects of this disclosure.
Figure 3B:
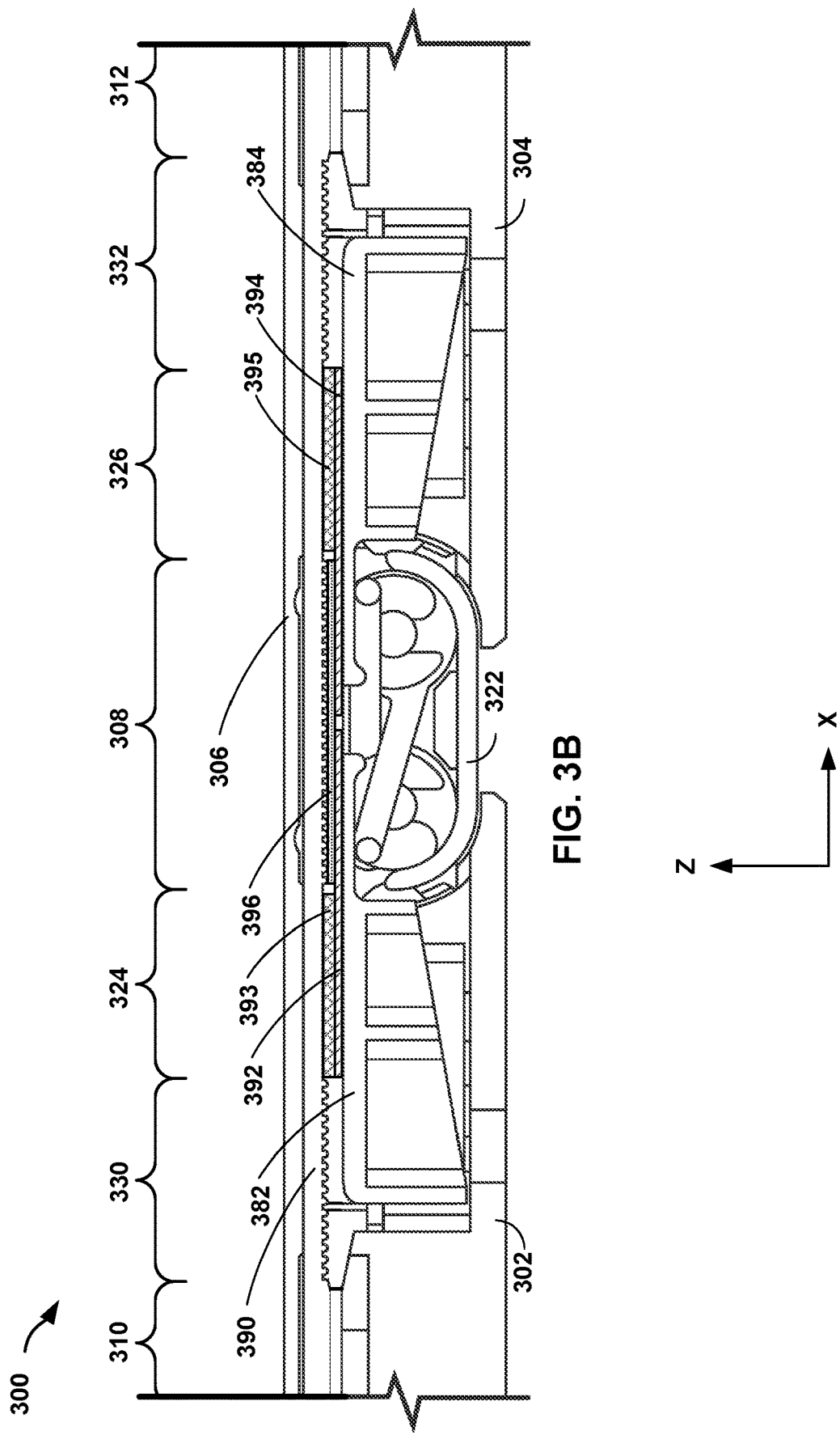

FIGS. 3A and 3B are schematic diagrams illustrating cross sections of a folding device with a flexible display having support platforms in a variety of positions, in accordance with one or more aspects of this disclosure. Folding device 300 may be an example of device 100 as discussed above. FIG. 3A illustrates folding device 300 in the fully closed position, and FIG. 3B illustrates folding device in the fully open position. As shown in FIGS. 3A and 3B, folding device 300 includes first assembly 302, second assembly 304, hinge assembly 322, continuous display 306, first collapsible support platform 382, second collapsible support platform 384, primary supporting plate 390, first supplemental supporting plate 392, and second supplemental supporting plate 394. First assembly 302, second assembly 304, hinge assembly 322, and continuous display 306 of FIGS. 3A and 3B may be examples of first assembly 102, second assembly 104, hinge assembly 122, continuous display 106 of FIGS. 1A and 1B. Similarly, primary flexible segment 308, rigid segment 310, rigid segment 312, rigid segment 324, rigid segment 326, hinge point 330, and hinge point 332 of continuous display 306 of FIGS. 3A and 3B may be examples of primary flexible segment 108, rigid segment 110, rigid segment 112, rigid segment 124, rigid segment 126, hinge point 130, and hinge point 132 of continuous display 106 of FIGS. 1A and 1B.

As discussed above, in some examples, a folding device, such as device 300, may include a plurality of supporting plates. For instance, as shown in FIGS. 3A and 3B, device 300 may include primary supporting plate 390. Primary supporting plate 390 may be a single supporting plate attached to a primary flexible segment and all primary and secondary rigid segments (e.g., first rigid segment 110, second rigid segment 112, rigid segment 124 and rigid segment 126) of display 306. Primary supporting plate 390 may be configured to permit bending between the segments. For instance, as shown in FIG. 3B, primary supporting plate 390 may be etched and/or perforated at a boundary between adjacent segments (e.g., at hinge points 330 and 332 (which may be referred to as secondary flexible segments) and at primary flexible segment 308).

In accordance with one or more aspects of this disclosure, in addition to primary supporting plate 390, device 300 may include first supplemental supporting plate 392, and second supplemental supporting plate 394. First supplemental supporting plate 392 and second supplemental supporting plate 394 may be attached to primary supporting plate 390. For instance, first supplemental supporting plate 392 may be attached to primary supporting plate 390 at a location that is adjacent to a third rigid segment of continuous display 306. Similarly, second supplemental supporting plate 394 may be attached to primary supporting plate 390 at a location that is adjacent to a fourth rigid segment of continuous display 306. In this context, the term adjacent may denote a position of primary supporting plate under/below the identified portion of continuous display 306.

As shown in FIG. 3B, when device 300 is fully open, a portion of first supplemental supporting plate 392 supports a portion of a primary flexible segment of continuous display 306 and a portion of second supplemental supporting plate 394 supports another portion of the primary flexible segment of continuous display 306.

Widths of first supplemental supporting plate 392 and second supplemental supporting plate 394 may be greater than widths of the third rigid segment and the fourth rigid segment of continuous display 306. In other words, a dimension of first supplemental supporting plate 392 along a particular axis perpendicular to a folding axis of folding device 300 (e.g., the X axis in FIG. 3B) is greater than a dimension of the third rigid segment along the particular axis, and a dimension of second supplemental supporting plate 904 along the particular axis is greater than a dimension of the fourth rigid segment along the particular axis. As the widths of the supplemental supporting plates 392/394 are greater than width of the rigid segments at which the supplemental supporting plates are attached, supplemental supporting plates 392/394 may be positioned such that excess widths of supplemental supporting plates 392/394 reside under the primary flexible segment when folding device 300 is fully open (e.g., as shown in FIG. 3B). As shown in FIG. 3B, when device 300 is fully open, collapsible support platforms 382 and 384 may respectively push supplemental supporting plates 392/394 against a rear/bottom surface of continuous display 306, further improving support. In this way, supplemental supporting plates 392/394 may be provide additional rigidity and/or stiffness to primary flexible segment 308. As such, supplemental supporting plates 392/394 may reduce a depth of a crease in primary flexible segment 308.

Supplemental supporting plates 392/394 may be attached to primary supporting plate 390 in a variety of ways. For instance, as shown in FIG. 3B, supplemental supporting plates 392/394 may be respectively attached to primary supporting plate 390 via double-sided tape 393/395. As such, device 300 may include double-sided tape 393 configured to attach supplemental supporting plate 392 to primary supporting plate 390 adjacent to rigid segment; 324 and double-sided tape 395 configured to attach supplemental supporting plate 394 to primary supporting plate 390 adjacent to rigid segment 326. Attaching supplemental supporting plates 392/394 using double-sided tape may present various advantages. For instance, the use of double-sided tape may enable supplemental supporting plates 392/394 to be attached closer to primary supporting plate 390 than other attachment means.

As noted above, primary supporting plate 390 may be etched or otherwise modified to permit bending/flexing. Such modification may create voids in primary supporting plate 390. Intrusion of dust or other particulate matter into said voids may result in damage or other undesirable impact. The level of etching may be different at different sections. For instance, a depth of etching and/or perforation of primary supporting plate 390 adjacent to primary flexible segment 308 may be greater than a depth of etching and/or perforation of primary supporting plate 390 at a boundary between rigid segment 310 and rigid segment 324 (e.g., etching adjacent to primary flexible segment 308 may be deeper than etching adjacent to hinge point 330).

In accordance with one or more aspects of this disclosure, protective membrane 396 may be attached to at least a portion of primary supporting plate 390. For instance, protective membrane 396 may be attached to a portion of primary supporting plate 390 that is adjacent to, or attached to, primary flexible segment 308. Protective membrane 396 may prevent and/or mitigate intrusion of particulate matter into voids of primary supporting plate 390. While illustrated in FIG. 3B as covering only the portion of primary supporting plate 390 that is adjacent to, or attached to, primary flexible segment 308, protective membrane 396 is not so limited. For instance, as discussed below and shown in FIG. 5, protective membrane 396 may extend from a portion of primary supporting plate 390 that is adjacent to rigid segment 324 to a portion of primary supporting plate 390 that is adjacent to rigid segment 326. In this way, protective membrane 396 may provide additional protection and/or may be more securely attached.

Figure 4:
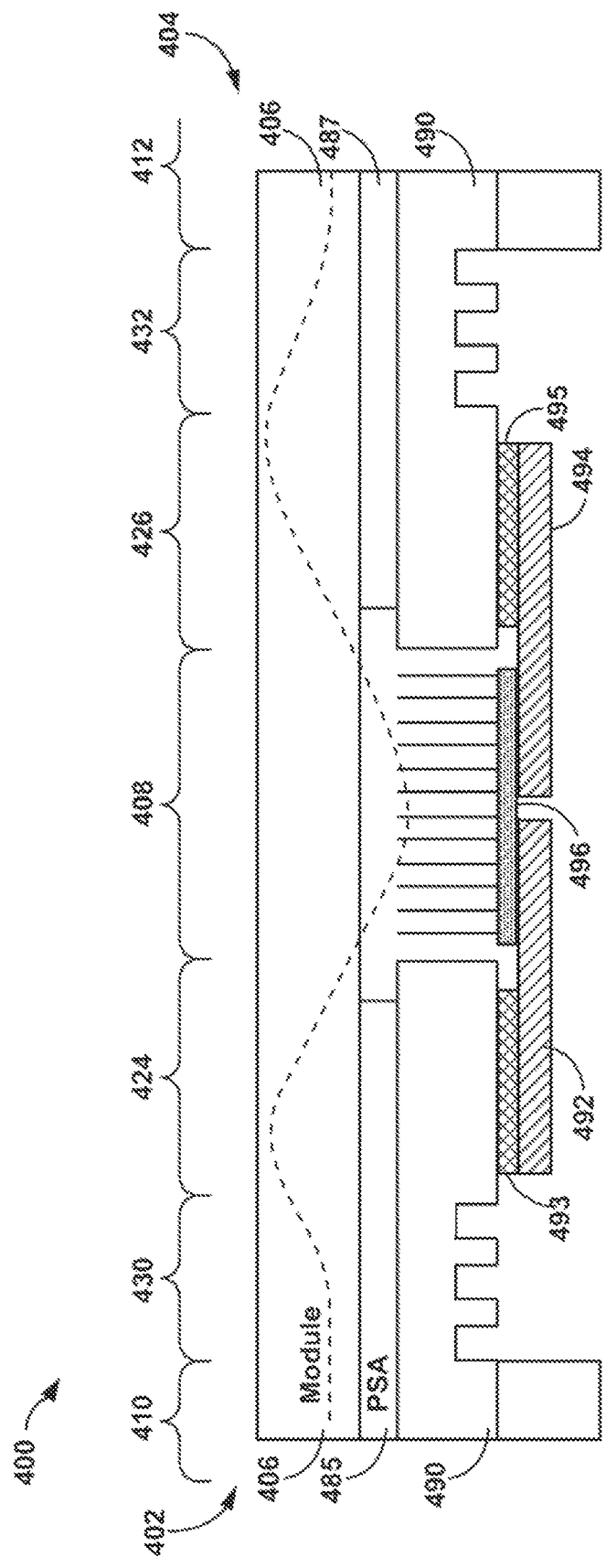
FIG. 4 is a schematic diagram illustrating a cross section of an example folding device with a multi-rigid segment flexible display, in accordance with one or more aspects of this disclosure.

FIG. 4 is a schematic diagram illustrating a cross section of an example folding device with a multi-rigid segment flexible display, in accordance with one or more aspects of this disclosure. As shown in FIG. 4, folding device 400 includes first assembly 402, second assembly 404, continuous display 406, primary supporting plate 490, first supplemental supporting plate 492, and second supplemental supporting plate 494. First assembly 402, second assembly 404, and continuous display 406 of FIG. 4 may be examples of first assembly 102, second assembly 104, continuous display 106 of FIGS. 1A and 1B. Similarly, primary flexible segment 408, rigid segment 410, rigid segment 412, rigid segment 424, rigid segment 426, hinge point 430, and hinge point 432 of continuous display 406 of FIG. 4 may be examples of primary flexible segment 108, rigid segment 110, rigid segment 112, rigid segment 124, rigid segment 126, hinge point 130, and hinge point 132 of continuous display 106 of FIGS. 1A and 1B. Double-sided tape 493, double-sided tape 495, and protective membrane 496 of FIG. 4 may be examples of double-sided tape 393, double-sided tape 395, and protective membrane 396 of FIGS. 3A and 3B.

As discussed above, a continuous display may be attached to a primary supporting plate. As shown in FIG. 4, continuous display may be attached to primary supporting plate 490 via adhesive 485 and adhesive 487. Adhesive 485 may attach sections 410, 430, and 424 of continuous display to primary supporting plate 490 while adhesive 487 may attach sections 412, 426, and 432 of continuous display to primary supporting plate 490. As shown in FIG. 4, in some examples, primary flexible segment 408 may not be adhered to primary supporting plate 490.

Figure 5:
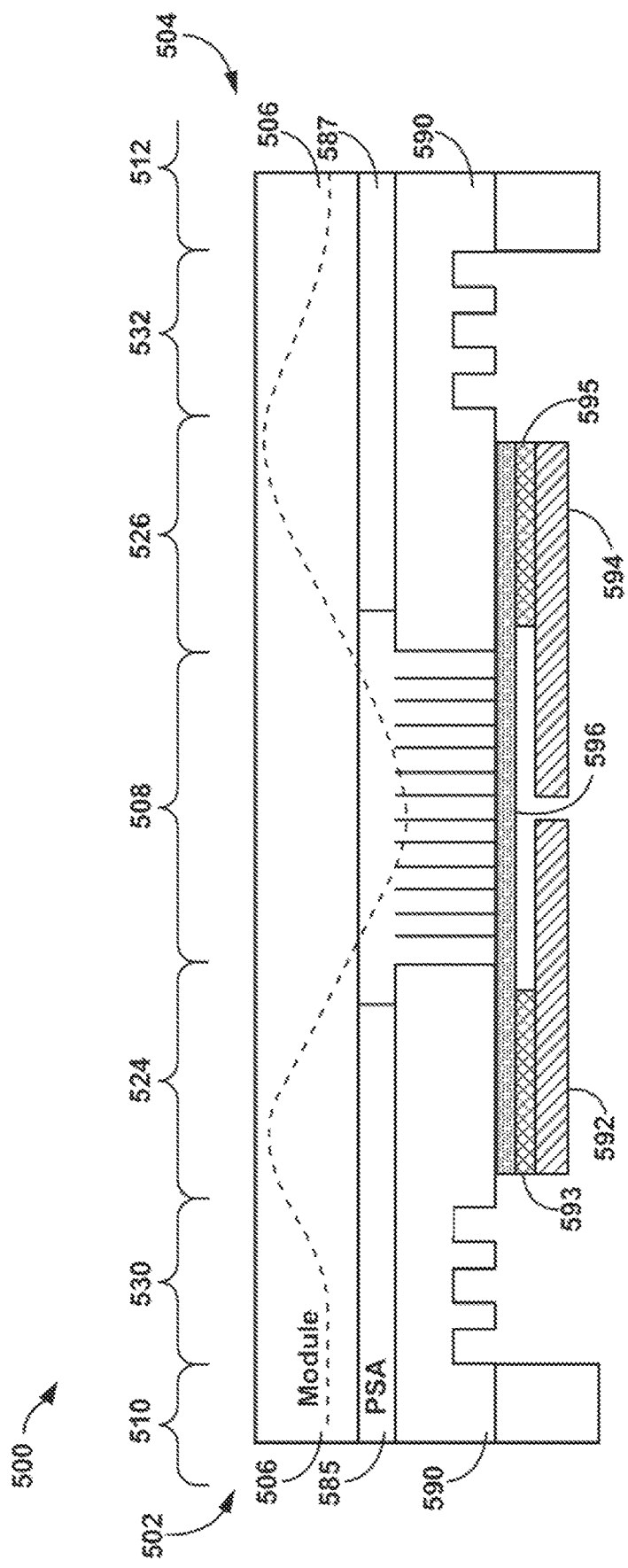
FIG. 5 is a schematic diagram illustrating a cross section of another example folding device with a multi-rigid segment flexible display, in accordance with one or more aspects of this disclosure.

FIG. 5 is a schematic diagram illustrating a cross section of another example folding device with a multi-rigid segment flexible display, in accordance with one or more aspects of this disclosure. As shown in FIG. 5, folding device 500 includes first assembly 502, second assembly 504, continuous display 506, primary supporting plate 590, first supplemental supporting plate 592, and second supplemental supporting plate 594. First assembly 502, second assembly 504, and continuous display 506 of FIG. 5 may be examples of first assembly 102, second assembly 104, continuous display 106 of FIGS. 1A and 1B. Similarly, primary flexible segment 508, rigid segment 510, rigid segment 512, rigid segment 524, rigid segment 526, hinge point 530, and hinge point 532 of continuous display 506 of FIG. 5 may be examples of primary flexible segment 108, rigid segment 110, rigid segment 112, rigid segment 124, rigid segment 126, hinge point 130, and hinge point 132 of continuous display 106 of FIGS. 1A and 1B. Double sided tape 593, double-sided tape 595, adhesive 585, adhesive 587, and protective membrane 596 of FIG. 5 may be examples of double-sided tape 493, double-sided tape 495, adhesive 485, adhesive 487, and protective membrane 496 of FIG. 4.

As discussed above, in some examples, a protective membrane may span different sections of a primary supporting plate. As shown in FIG. 4, protective membrane 496 may span an area of primary supporting plate 490 adjacent to primary flexible segment 408. As shown in FIG. 5, protective membrane 596 may span an area of primary supporting plate 590 adjacent to primary flexible segment 508 and further extending from rigid segment 524 to rigid segment 526. In both examples, the supplemental supporting plates may be considered to be attached to the primary supporting plate. For instance, even in the example of FIG. 5 where supplemental supporting plates 592/594 are attached to primary supporting plate 590 via protective membrane 596, supplemental supporting plates 592/594 may be considered to be attached to primary supporting plate 590.

Figure 6:
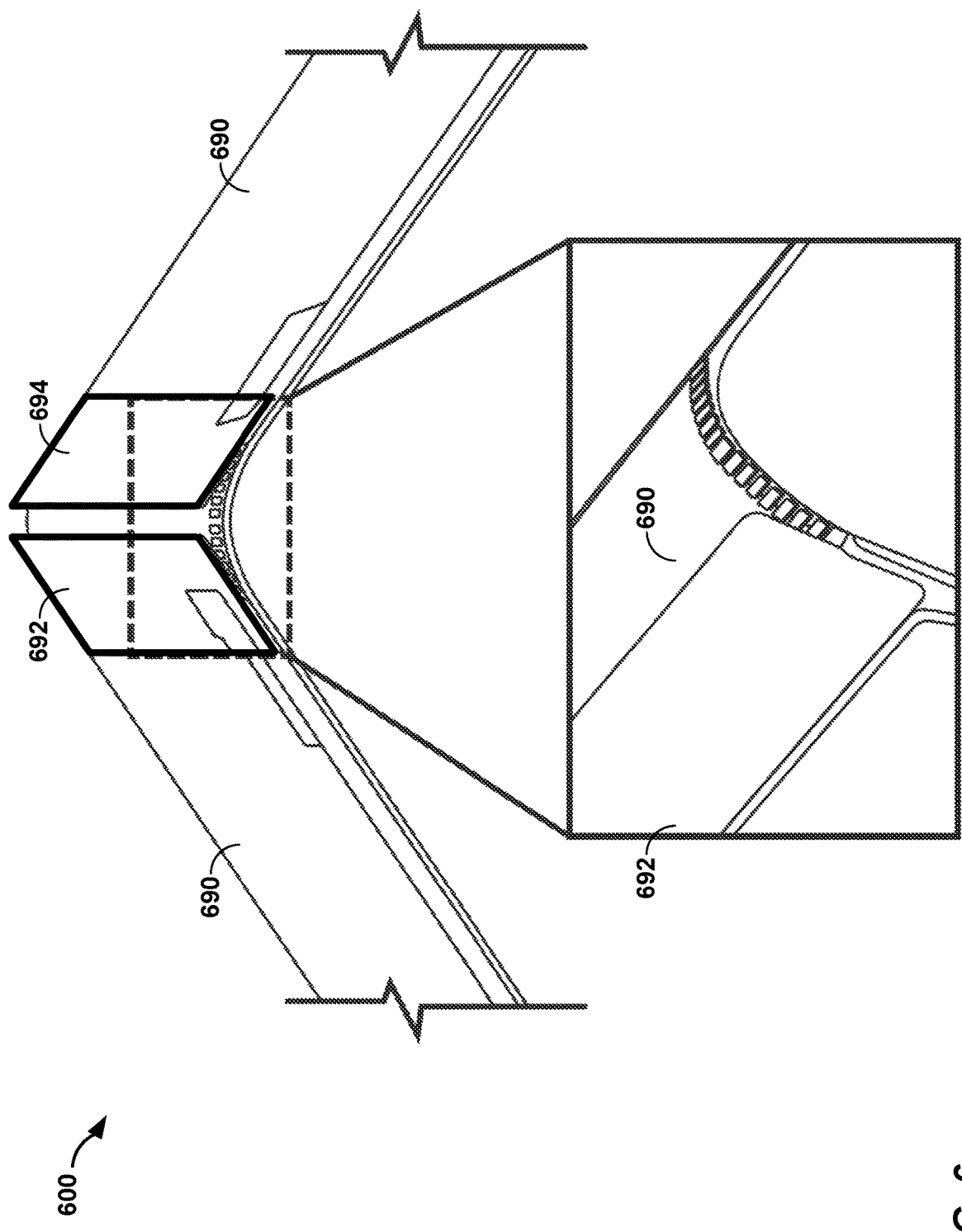
FIG. 6 is a schematic diagram illustrating supporting plates of a folding device, in accordance with one or more aspects of this disclosure.

FIG. 6 is a schematic diagram illustrating supporting plates of a folding device, in accordance with one or more aspects of this disclosure. As shown in FIG. 6, device 600 may include primary supporting plate 690, first supplemental supporting plate 692, and second supplemental supporting plate 694. Device 600, primary supporting plate 690, first supplemental supporting plate 692, and second supplemental supporting plate 694 may be examples of device 500, primary supporting plate 590, first supplemental supporting plate 592, and second supplemental supporting plate 594 of FIG. 5.

The following numbered example may illustrate one or more aspects of this disclosure:

Example 1. A folding device comprising: a first assembly having an inner and an outer surface; a second assembly having an inner and an outer surface; a continuous display including: a first rigid segment attached to and substantially coplanar with the inner surface of the first assembly; a second rigid segment attached to and substantially coplanar with the inner surface of the second assembly; a primary flexible segment; a third rigid segment disposed between the second rigid segment and the primary flexible segment, wherein the third rigid segment is articulable relative to the second rigid segment; and a fourth rigid segment disposed between the first rigid segment and the primary flexible segment, wherein the fourth rigid segment is articulable relative to the first rigid segment; a primary supporting plate attached to the continuous display; a first supplemental supporting plate attached to the primary supporting plate adjacent to the third rigid segment of the continuous display; and a second supplemental supporting plate attached to the primary supporting plate adjacent to the fourth rigid segment of the continuous display.

Example 2. The folding device of example 1, wherein, when the folding device is fully open, a portion of the first supplemental supporting plate supports the primary flexible segment and a portion of the second supplemental supporting plate supports the primary flexible segment.

Example 3. The folding device of example 1, wherein a dimension of the first supplemental supporting plate along a particular axis perpendicular to a folding axis of the folding device is greater than a dimension of the third rigid segment along the particular axis, and wherein a dimension of the second supplemental supporting plate along the particular axis is greater than a dimension of the fourth rigid segment along the particular axis.

Example 4. The folding device of example 1, further comprising: first double-sided tape configured to attach the first supplemental supporting plate to the primary supporting plate adjacent to the third rigid segment; and second double-sided tape configured to attach the second supplemental supporting plate to the primary supporting plate adjacent to the fourth rigid segment.

Example 5. The folding device of example 1, wherein the primary supporting plate includes a single supporting plate attached to the primary flexible segment, the first rigid segment, the second rigid segment, the third rigid segment, and the fourth rigid segment, and wherein the single supporting plate is configured to permit bending between the segments.

Example 6. The folding device of example 5, further comprising: protective membrane attached a portion of the single supporting plate that is attached to the primary flexible segment.

Example 7. The folding device of example 6, wherein the protective membrane is further attached to a portion of the single supporting plate that is attached to the third rigid segment and a portion of the single supporting plate that is attached to the fourth rigid segment.

Example 8. The folding device of example 5, wherein, to permit bending between segments, the primary supporting plate is etched and/or perforated at boundaries between adjacent segments.

Example 9. The folding device of example 8, wherein a depth of etching and/or perforation of the primary supporting plate adjacent to the primary flexible segment is greater than a depth of etching and/or perforation of the primary supporting plate at a boundary between the first rigid segment and the fourth rigid segment.

Example 10. The folding device of example 1, further comprising: a first collapsible support platform attached to the first assembly and configured to support the first supplemental supporting plate when the folding device is fully opened; and a second collapsible support platform attached to the second assembly and configured to support the second supplemental supporting plate when the folding device is fully opened.

Example 11. The folding device of example 1, wherein the continuous display comprises an organic light-emitting diode (OLED) display or a micro light emitting diode display.

Example 12. A display assembly of a folding device comprising: a continuous display including: a first rigid segment attached to and substantially coplanar with an inner surface of a first assembly of the folding device; a second rigid segment attached to and substantially coplanar with an inner surface of a second assembly of the folding device; a primary flexible segment; a third rigid segment disposed between the second rigid segment and the primary flexible segment, wherein the third rigid segment is articulable relative to the second rigid segment; and a fourth rigid segment disposed between the first rigid segment and the primary flexible segment, wherein the fourth rigid segment is articulable relative to the first rigid segment; a primary supporting plate attached to the continuous display; a first supplemental supporting plate attached to the primary supporting plate adjacent to the third rigid segment of the continuous display; and a second supplemental supporting plate attached to the primary supporting plate adjacent to the fourth rigid segment of the continuous display.

Various aspects have been described in this disclosure. These and other aspects are within the scope of the following claims.

The invention claimed is:
1. A folding device comprising:
a first assembly;
a second assembly;
a continuous display including:
 a first rigid segment positioned on a first side of the continuous display that overlies the first assembly;
 a second rigid segment positioned on a second side of the continuous display that overlies the second assembly;
 a primary flexible segment disposed between the first rigid segment and the second rigid segment;
a primary supporting plate attached to the continuous display, wherein the primary supporting plate includes a single supporting plate attached to the primary flexible segment, the first rigid segment, and the second rigid segment, and wherein the single supporting plate is configured to permit bending at the primary flexible segment;

protective membrane attached to a portion of the single supporting plate that is attached to the primary flexible segment;

a first supplemental supporting plate attached to the primary supporting plate adjacent to the first rigid segment of the continuous display;

a second supplemental supporting plate attached to the primary supporting plate adjacent to the second rigid segment of the continuous display;

a first collapsible support platform attached to the first assembly and configured to support the protective membrane and push the first supplemental supporting plate against a rear surface of the continuous display when the folding device is fully opened, wherein the first collapsible support platform collapses to make room for the continuous display when the folding device is fully closed; and a second collapsible support platform attached to the second assembly and configured to support the protective membrane and push the second supplemental supporting plate against the rear surface of the continuous display when the folding device is fully opened, wherein the second collapsible support platform collapses to make room for the continuous display when the folding device is fully closed.

2. The folding device of claim 1, wherein, when the folding device is fully open, a portion of the first supplemental supporting plate supports the primary flexible segment and a portion of the second supplemental supporting plate supports the primary flexible segment.

3. The folding device of claim 1, further comprising:
first double-sided tape configured to attach the first supplemental supporting plate to the primary supporting plate adjacent to the first rigid segment; and
second double-sided tape configured to attach the second supplemental supporting plate to the primary supporting plate adjacent to the second rigid segment.

4. The folding device of claim 1, wherein the protective membrane is further attached to a portion of the single supporting plate that is attached to the first rigid segment and a portion of the single supporting plate that is attached to the second rigid segment.

5. The folding device of claim 1, wherein, to permit bending at the primary flexible segment, the primary supporting plate is etched and/or perforated at the primary flexible segment.

6. The folding device of claim 1, wherein the continuous display comprises an organic light-emitting diode (OLED) display or a micro light emitting diode display.

7. A display assembly of a folding device comprising: a continuous display including: a first rigid segment positioned on a first side of the continuously display that overlies a first assembly of the folding device; a second rigid segment positioned on a second side of the continuously display that overlies a second assembly of the folding device; a primary flexible segment disposed between the first rigid segment and the second rigid segment; a primary supporting plate attached to the continuous display, and the primary supporting plate includes a single supporting plate attached to the primary flexible segment, the first rigid segment, the second rigid segment, the third rigid segment, and the fourth rigid segment, and wherein the single supporting plate is configured to permit bending between the segments; and protective membrane attached a portion of the single supporting plate that is attached to the primary flexible segment; and a first collapsible support platform attached to the first assembly and configured to support the protective membrane and; a first supplemental supporting plate attached to the primary supporting plate adjacent to the first rigid segment of the continuous display; a second supplemental supporting plate attached to the primary supporting plate adjacent to the second rigid segment of the continuous display;

a first collapsible support platform attached to the first assembly and configured to support the protective membrane and push the first supplemental supporting plate against a rear surface of the continuous display when the folding device is fully opened, wherein the first collapsible support platform collapses to make room for the continuous display when the folding device is fully closed; and a second collapsible support platform attached to the second assembly and configured to support the protective membrane and push the second supplemental supporting plate against the rear surface of the continuous display when the folding device is fully opened, wherein the second collapsible support platform collapses to make room for the continuous display when the folding device is fully closed.

8. The display assembly of claim 7, wherein, when the folding device is fully open, a portion of the first supplemental supporting plate supports the primary flexible segment and a portion of the second supplemental supporting plate supports the primary flexible segment.

9. The display assembly of claim 7, further comprising:
first double-sided tape configured to attach the first supplemental supporting plate to the primary supporting plate adjacent to the first rigid segment; and
second double-sided tape configured to attach the second supplemental supporting plate to the primary supporting plate adjacent to the second rigid segment.

10. The display assembly of claim 7, wherein the protective membrane is further attached to a portion of the single supporting plate that is attached to the first rigid segment and a portion of the single supporting plate that is attached to the second rigid segment.

11. The display assembly of claim 7, wherein, to permit bending at the primary flexible segment, the primary supporting plate is etched and/or perforated at the primary flexible segment.

12. The folding device of claim 1, wherein the primary supporting plate includes a single supporting plate attached to the primary flexible segment, the first rigid segment, and the second rigid segment, and wherein the single supporting plate is configured to permit bending at the primary flexible segment, the folding device further comprising:
first double-sided tape configured to attach the first supplemental supporting plate to the primary supporting plate adjacent to the first rigid segment;
second double-sided tape configured to attach the second supplemental supporting plate to the primary supporting plate adjacent to the second rigid segment; and
protective membrane attached a portion of the single supporting plate that is attached to the primary flexible segment.

13. The folding device of claim 1, wherein a width of the first supplemental supporting plate along an axis perpendicular to a folding axis of the folding device is less than a width of the first collapsible support platform along the axis perpendicular to the folding axis of the folding device.

* * * * *